(12) United States Patent
Shapira et al.

(10) Patent No.: US 11,054,877 B2
(45) Date of Patent: Jul. 6, 2021

(54) POWER MANAGEMENT BASED ON REAL TIME PLATFORM POWER SENSING

(71) Applicant: Intel Corporation, Santa Clara, CA (US)

(72) Inventors: Dorit Shapira, Atlit (IL); Anand K. Enamandram, Folsom, CA (US); Daniel Cartagena, Chandler, AZ (US); Krishnakanth Sistla, Portland, OR (US); Jorge P. Rodriguez, Portland, OR (US); Efraim Rotem, Haifa (IL); Nir Rosenzweig, Givat Ela (IL)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 16/012,623

(22) Filed: Jun. 19, 2018

(65) Prior Publication Data

US 2019/0041951 A1   Feb. 7, 2019

Related U.S. Application Data

(60) Provisional application No. 62/542,083, filed on Aug. 7, 2017.

(51) Int. Cl.
| | |
|---|---|
| *G06F 1/26* | (2006.01) |
| *G06F 1/32* | (2019.01) |
| *G06F 1/3206* | (2019.01) |
| *G06F 1/3287* | (2019.01) |
| *G06F 1/3296* | (2019.01) |
| *G06F 1/324* | (2019.01) |

(Continued)

(52) U.S. Cl.
CPC .......... *G06F 1/3206* (2013.01); *G06F 1/324* (2013.01); *G06F 1/3243* (2013.01); *G06F 1/3287* (2013.01); *G06F 1/3296* (2013.01); *H03M 1/12* (2013.01)

(58) Field of Classification Search
CPC ...... G06F 1/3206; G06F 1/3296; G06F 1/324; G06F 1/3243; G06F 1/3287; H03M 1/12
See application file for complete search history.

(56) References Cited

U.S. PATENT DOCUMENTS

| | | | |
|---|---|---|---|
| 6,606,047 B1 * | 8/2003 | Borjesson | H03M 1/12 341/118 |
| 9,170,912 B1 * | 10/2015 | Hu | G06F 11/3062 |
| 9,891,682 B1 * | 2/2018 | Czamara | G06F 1/266 |

(Continued)

OTHER PUBLICATIONS

Issaku Nethala, Wayback Machine Capture of "Types of Faults and Effects in Electrical Power Systems", ELPROCUS 2014 (Year: 2014).*

*Primary Examiner* — Danny Chan
(74) *Attorney, Agent, or Firm* — Green, Howard & Mughal LLP

(57) ABSTRACT

An apparatus is provided, where the apparatus includes a plurality of components; a first sensing system to measure first power consumed by first one or more components of the plurality of components; a second sensing system to measure second power consumed by the apparatus; an analog-to-digital converter (ADC) to generate an identification (ID) that is representative of the second power consumed by the apparatus; and a controller to allocate power budget to one or more components of the plurality of components, based on the measurement of the first power and the ID.

19 Claims, 6 Drawing Sheets

(51) Int. Cl.
  *G06F 1/3234* (2019.01)
  *H03M 1/12* (2006.01)

(56) References Cited

U.S. PATENT DOCUMENTS

| | | | | |
|---|---|---|---|---|
| 2003/0187520 | A1* | 10/2003 | Pearlman | H02J 3/005 700/11 |
| 2007/0028130 | A1* | 2/2007 | Schumacher | G06F 1/28 713/320 |
| 2010/0064162 | A1* | 3/2010 | Rotem | G06F 1/206 713/340 |
| 2011/0022356 | A1* | 1/2011 | Nussbaum | G06F 1/3203 702/182 |
| 2011/0226462 | A1* | 9/2011 | Sato | G06F 1/206 165/247 |
| 2011/0264933 | A1* | 10/2011 | Forsythe | G06F 1/266 713/320 |
| 2013/0125123 | A1* | 5/2013 | Shetty | G06F 9/5077 718/1 |
| 2014/0089603 | A1* | 3/2014 | Krishnapura | G06F 12/0831 711/146 |
| 2014/0095905 | A1* | 4/2014 | Sistla | G06F 1/329 713/320 |
| 2014/0189376 | A1* | 7/2014 | Rotem | G06F 1/206 713/300 |
| 2015/0155694 | A1* | 6/2015 | Goodson | H02H 9/041 361/117 |
| 2016/0246342 | A1* | 8/2016 | Muthukaruppan | G05F 1/59 |
| 2016/0308369 | A1* | 10/2016 | Gupta | F03D 7/0284 |
| 2017/0083067 | A1* | 3/2017 | Ganor | G06F 1/26 |
| 2017/0168541 | A1* | 6/2017 | Gendler | G06F 1/3296 |
| 2017/0248996 | A1* | 8/2017 | Zhang | G06F 1/26 |
| 2017/0288648 | A1* | 10/2017 | Tang | G05F 1/46 |
| 2017/0364132 | A1* | 12/2017 | Gendler | G06F 1/324 |
| 2018/0032124 | A1* | 2/2018 | Fukuoka | G06F 1/3206 |

* cited by examiner

POWER MANAGEMENT BASED ON REAL TIME PLATFORM POWER SENSING

CLAIM FOR PRIORITY

This application claims priority to Provisional Application Ser. No. 62/542,083, filed Aug. 7, 2017, titled "APPARATUS AND METHOD FOR MANAGING POWER OF COMPUTING NODES IN REAL-TIME", and which is incorporated by reference in entirety.

BACKGROUND

Power management in a computing system is a complex task. Usually, power management is handled by software, which may provide updated power budget at periodic intervals of about 25 milliseconds or longer.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
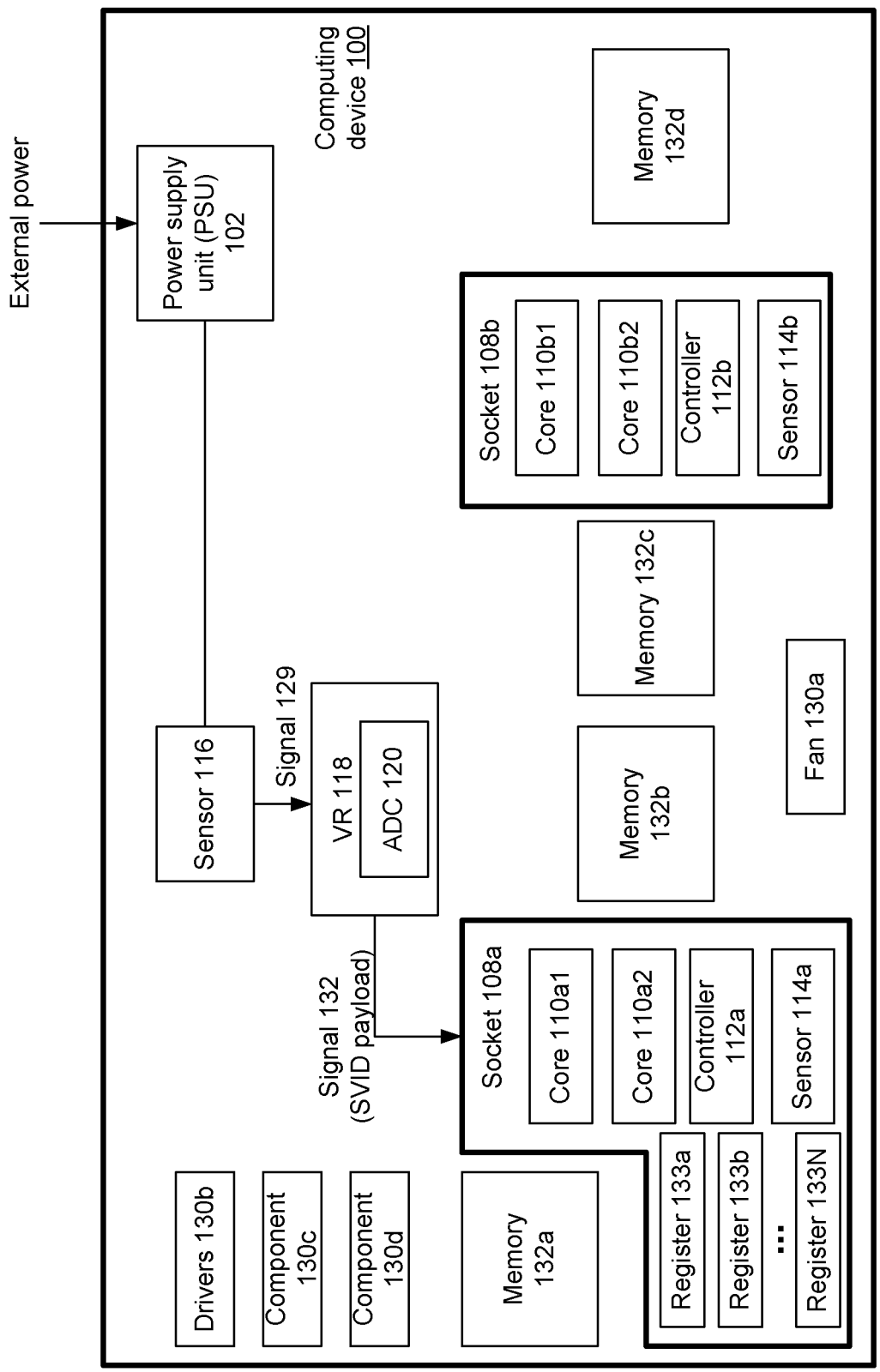
FIG. 1 schematically illustrate a computing device that measures in real time platform input power, and that allocates power budget to various components based at least in part on the platform input power, according to some embodiments.

In some embodiments, a computing platform (also referred to as computing device, or merely as a device) may comprise multiple processor sockets, where each socket may include corresponding processing cores. The device may further comprise multiple sensors corresponding to the multiple processor sockets, such that a sensor may measure power consumption of a corresponding socket. Furthermore, a system power sensor may measure total platform input power. A power control unit (PCU, also referred to as controller herein) may be implemented in a socket. The PCU may receive measurements from various sensors. The PCU may also access power limits of various sockets, as well as power limits of various other components, which may be stored in corresponding registers.

In some embodiments, the PCU may allocate power budgets to various components of the device, based on the measurements of the total platform input power, measurements of power consumption of various sockets, power limits of various components, etc. The allocation of power budget may be dynamic. For example, if a component does not fully use the allocated power budget, the power budget of the component may be reduced and power budgets of one or more other components may be correspondingly increased.

In some embodiments, the PCU may be implemented in hardware and/or firmware, and may execute Pcodes. In an example, the sensing may be done in a relatively high frequency, such as every 80 to 100 microseconds merely as an example. Merely as an example, the PCU may update its power allocation decision every at most 5 milliseconds.

During normal operation, the sensor measuring the total platform input power may transmit the analog measurement information to the PCU via an ADC. However, in an event of power spike, the sensor measuring the total platform input power may directly transmit the power spike information to the PCU, e.g., by bypassing the ADC. In another example, the ADC may transmit the power spike information to the PCU, e.g., even before the analog-to-digital conversion in completed. The PCU may immediately throttle one or more processing cores, thereby mitigating or reducing the power spike. Other technical effects will be evident from the various embodiments and figures.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

FIG. 1 schematically illustrate a computing device 100 (also referred to henceforth as device 100, or computing platform 100) that measures in real time platform input power, and that allocates power budget to various components based at least in part on the platform input power, according to some embodiments. In some embodiments, the device 100 may be any appropriate computing device or computing platform, e.g., a server system, a server rack, a laptop, a desktop, a mobile computing device, a cellular phone, and/or the like.

The device 100 may comprise multiple processor sockets (also referred to as sockets) 108*a*, 108*b*. Although the device 100 may comprise multiple sockets, the example of FIG. 1 illustrates merely two sockets 108*a*, 108*b* for purposes of illustrative clarity—the device 100 may include more than two sockets. Individual sockets may include multiple processing cores. For example, the socket 108*a* may comprise cores 110*a*1 and 110*a*2, and the socket 108*b* may comprise cores 110*b*1, and 110*b*2. Although individual sockets are illustrated to include merely two corresponding cores, such a number of cores is merely an example, and a socket may include any appropriate number of cores.

Elements referred to herein with a common reference label followed by a particular number or alphabet may be collectively referred to by the reference label alone. For example, sockets 108*a*, 108*b* may be collectively and generally referred to as sockets 108 in plural, and socket 108 in singular. Similarly cores 110*al*, 110*a*2 may be collectively and generally referred to as cores 110*a* in plural, and core 110*a* in singular.

In some embodiments, the socket 108*a* comprises, in addition to the cores 110*a*, a sensor 114*a*; and the socket 108*b* comprises, in addition to the cores 110*b*, a sensor 114*b*. Although the sensors 114*a*, 114*b* are illustrated to be included in the corresponding sockets 108*a*, 108*b*, in some examples the sensors 114*a*, 114*b* may be external to the sockets 108*a*, 108*b*.

A sensor 114 may measure power consumed by a corresponding socket 108. For example, the sensor 114*a* may measure power consumed by the socket 108*a*, and the sensor 114*b* may measure power consumed by the socket 108*b*. In some embodiments, any appropriate type of sensors 114 may be used.

In some embodiments, a socket 108 may be included in a corresponding die (where the die is not labelled in FIG. 1). For example, a die may comprise a System on a Chip (SOC), including a corresponding socket 108. A sensor 114 may measure power consumed by the corresponding die, including by the corresponding socket 108. An on-die power measurement sensor 114 may be used to measure the power consumption.

In some embodiments, a socket 108 may include a corresponding controller 112. For example, the socket 108*a* may include a corresponding controller 112*a*, and the socket 108*b* may include a corresponding controller 112*b*. The controller 112 may be a Power Control Unit (PCU) to control power of the corresponding socket, and/or to control power of one or more components of the device 100, as will be discussed in further details herein.

In some embodiments, the device 100 may comprise memory 132*a*, 132*b* associated with the socket 108*a*, and memory 132*c*, 132*c* associated with the socket 108*b*. For example, the memory 132*a*, 132*b* may primarily be accessed by the cores 110*a*1, 110*a*2 of the socket 108*a*, and the memory 132*c*, 132*d* may primarily be accessed by the cores 110*b*1, 110*b*2 of the socket 108*b* (although the socket 108*b* may also access the memory 132*a*, 132*b*, and the socket 108*a* may also access the memory 132*c*, 132*d*).

The device 100 may comprise other components, e.g., fan 130*a*, drivers 130*b*, and one or more other components that are generally labelled as components 130*c*, 130*d*. The fan 130*a*, drivers 130*b*, and the components 130*c*, 130*d* are generally referred to as components 130 in plural, and component 130 in singular.

In some embodiments, the device 100 comprises a power supply unit (PSU) 102 that may transmit input power to the device 100. For example, the PSU 102 may be an Alternating Current (AC) adapter that is to receive external AC power (indicated as external power in FIG. 1) and to supply Direct Current (DC) power to the device 100. In another example, the PSU 102 may receive external DC power, and supply the DC power to the device 100. Thus, in an example, the PSU 102 may supply input power to the device 100.

Figure 2:
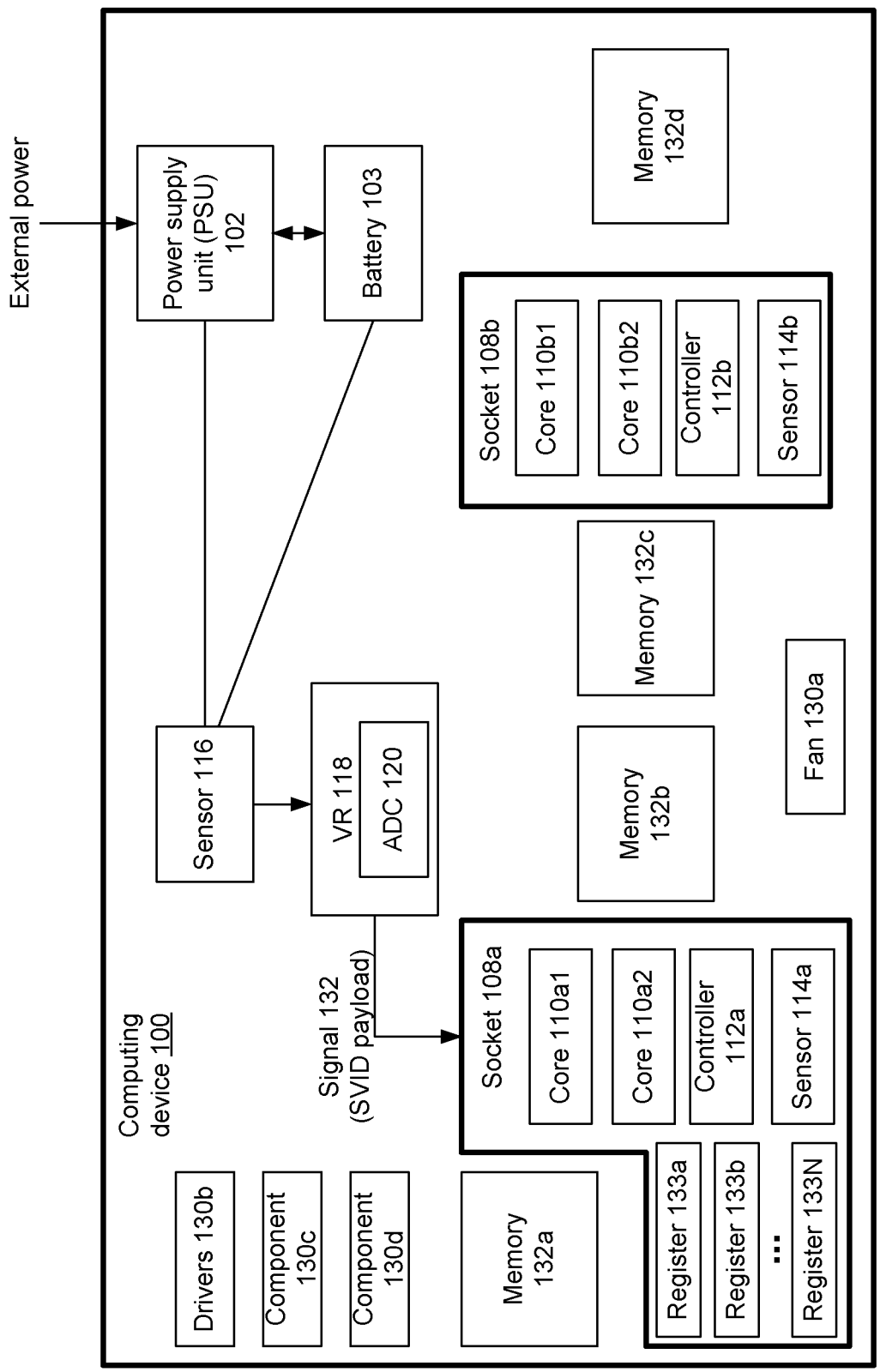
FIG. 2 illustrates the computing device of FIG. 1 including a battery, according to some embodiments.

In the example of FIG. 1, it is assumed that the device 100 does not include a battery, although the device 100 may include a battery. For example, FIG. 2 illustrates the computing device 100 of FIG. 1 including a battery 103, according to some embodiments. Although not illustrated in FIGS. 1-2, the PSU 102 and/or the battery 103 supplies power to various components of the device 100.

In some embodiments, input power (e.g., power supplied by the PSU 1-2 and/or the battery 103) is a finite resource. The nature of the input power limits may be as simple as capacity of input power supplies, and as complex as imposed power limits dependent on a cost of the power company rates at the time of implementation.

Referring to FIGS. 1 and 2, in some embodiments, the device 100 may further comprise a sensor 116 that is to measure an input power to the device 100, which may be a total power consumed by the device 100. The power measured by the sensor 116 may also be referred to as platform power, total DC system power, total system power, platform input power, and/or the like. In the example of FIG. 1, the sensor 116 may measure the power supplied by the PSU 102. In the example of FIG. 2, the sensor 116 may measure the power supplied by the combination of the PSU 102 and the battery 103. The sensor 116 may measure DC system power of the device 100.

In an example, a sensor 116 may be included in an Integrated Circuit (IC) chip that measures total DC input power (e.g., generated by the PSU 102), and converts the measurement to a current proportional, noise immune analog signal 129.

In some embodiments, the output signal 129 of the sensor 116 may be analog, which may be a noise immune analog signal. In some embodiments, the analog signal 129 output by the sensor 116 may be converted in a digital form by an ADC 120. In the example of FIGS. 1 and 2, the ADC 120 is implemented as a part of a Voltage Regulator (VR) 118. For example, the VR 118 of the device 100 may include one or more ADCs. The analog output of the sensor 116 may be converted in the digital form using the ADC 120 of the one or more ADCs of the VR 118. Thus, the ADC 120 used to convert the output of the sensor 116 may be shared with the VR 118.

Figure 3:
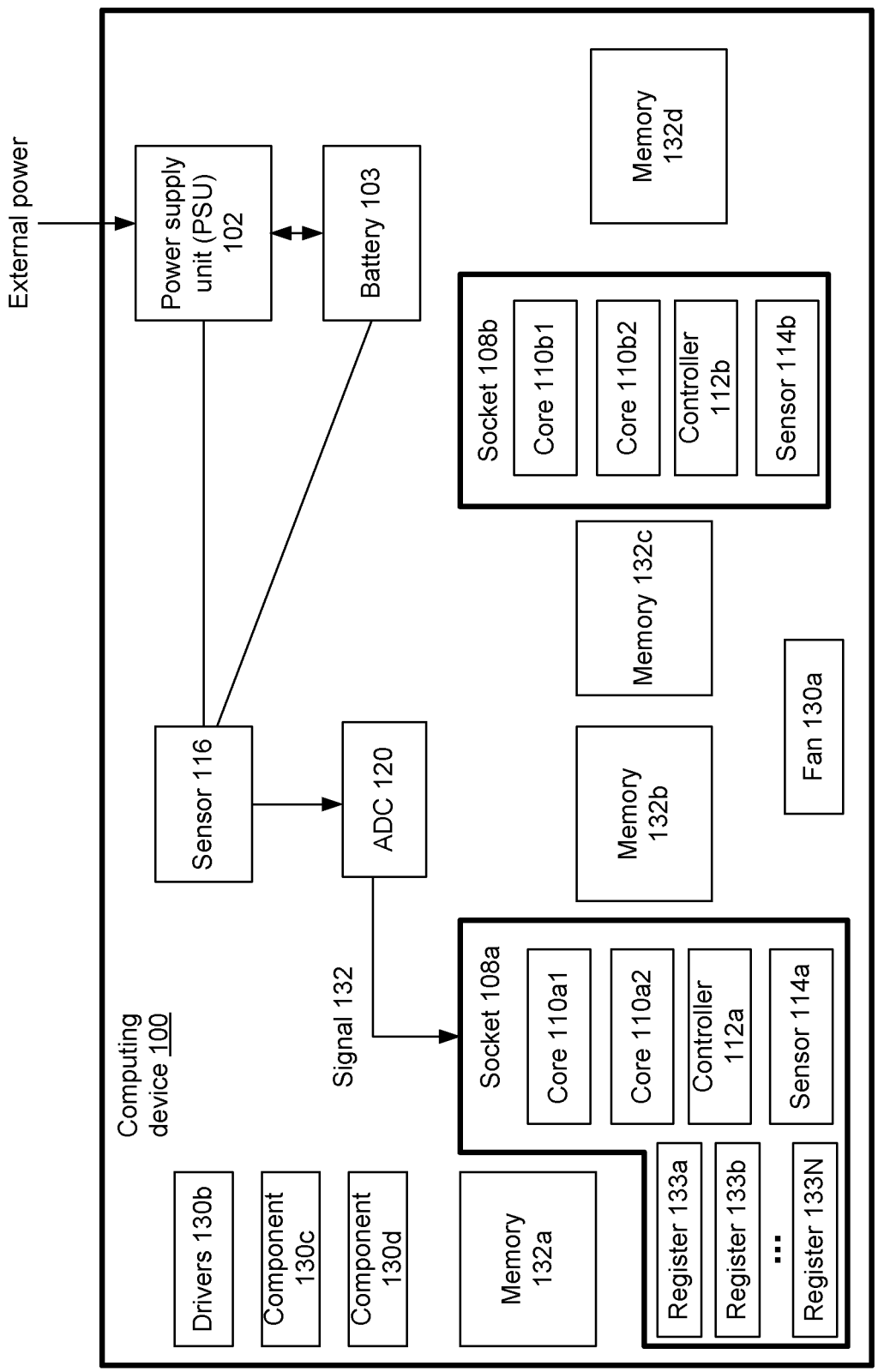
FIG. 3 illustrates the computing device of FIG. 1, where a sensor is used to measure system input power, and where an analog input of the sensor is converted in digital form using an Analog to Digital Converter (ADC) that is not associated with, or included in, a voltage regulator, according to some embodiments.

However, in some other examples, the ADC 120 may not be associated with, or included in, the VR 118. For example, FIG. 3 illustrates the computing device 100 of FIG. 1, where the sensor 116 is used to measure system input power, and where an analog input of the sensor 116 is converted in digital form using the ADC 120 that is not associated with, or included in, a VR, according to some embodiments. Thus, in the example of FIG. 3 and unlike FIGS. 1 and 2, the ADC 120 is not included in, or associated with, the VR 118.

In some embodiments (e.g., in FIGS. 1 and/or 2), the sensor 116 may be integrated within the VR 118. In an example and as discussed herein, the output of the sensor 116 may be noise immune analog signal that indicates the system power. In an example, the sensor 116 may be placed relatively close to the power source input (e.g., PSU 102), e.g., to a point in the power supply line before the power gets distributed to various subsystems or components of device 100.

In FIGS. 1-3, the ADC 120 generates a digital signal 132 that is representative of the analog output of the sensor 116, and the VR 118 transmits the signal 132 to the socket 108*a* (e.g., to the controller 112*a*). Thus, the signal 132 is representative of a total system input power of the device 100.

The socket 108*a* may transmit Voltage Identifications (VIDs) to the VR 118, where a VID may indicate a desired output voltage of the VR 118. In an example, the socket 108*a* may transmit the VIDs to the VR 118 over a Serial VID (SVID) bus or SVID interface, or over another appropriate high-speed communication bus (e.g., a Power Management Bus (PMBus)). In some embodiments, the VR 118 may transmit the signal 132 as a SVID payload to the socket 108*a* (e.g., to the controller 112*a*) over the SVID interface (or over another appropriate high-speed communication bus between the VR 118 and the socket 108*a*, such as the PMBus). The signal 132, which may be the SVID payload, may be indicative of the total system input power of the device 100. The VR 118 outputs the SVID payload signal 132 over, for example, a SVID channel. The SVID channel may be a standard interface used to communicate the VIDs from the socket 108*a* to the VR 118, as well as power telemetry (e.g., signal 132) from the VR 118 to the socket 108*a*.

Thus, voltage IDs output by the VR 118 for voltage regulation purposes, as well as the SVID signal 132, may share the same SVID channel between the VR 118 and the socket 108*a*. As the SVID channel is a relatively fast data transmission channel, the SVID channel may be reused for transmission of the digital conversion of the analog output of the sensor 116 (e.g., reused for transmission of the signal 132).

In the example of FIG. 3 where the ADC 120 is not part of a VR, the output signal 132 of the ADC 120 may be an ID signal comprising one or more bits that are indicative of the total system input power of the device 100.

Referring to FIGS. 1-3, the controller 112a may be based on hardware and/or firmware of one or more of the cores 110a of the socket 108a. In some embodiments, the controller 112a receives the digital signal 132. The controller 112a may also receive outputs of the sensors 114a and 114b (e.g., in case of more than two sockets in the device 100, the controller 112a may receive measurements of power consumed by individual ones of the various sockets). In some embodiments, the controller 112a may allocate power budget or power limit of various components of the device 100, based on the received measurement of the total system power (e.g., as indicated in the signal 132) and the received measurements of the power consumption of individual sockets 108 (e.g., as measured by the sensors 114). For example, the controller 112a may calculate available frequency headroom, while meeting programmed power limits.

In some embodiments, the socket 108a may comprise a plurality of registers 133a, 133b, . . . , 13N. Individual ones of the registers 133 may be programmed with a corresponding power limit. For example, a first register 133a may be programmed with a first socket power limit of a socket 108a (e.g., a maximum amount of power that may be consumed by the socket 108a), a second register 133b may be programmed with a first memory power limit of a memory 132a (e.g., a maximum amount of power that may be consumed by the memory 132a), a third register 133c may be programmed with a second socket power limit of a socket 108b (e.g., a maximum amount of power that may be consumed by the socket 108b), and so on.

In an example, the multiple registers 133 may be programmed by one or more agents (not specifically labelled in FIG. 1) of the device 100 using, for example, an out of band mechanism. In another example, the multiple registers 133 may be programmed using in band mechanism, such as software. The controller 112a may honor the programmed power limits of the registers 133, while allocating power budget (e.g., while setting voltage, frequency, etc.) to one or more components of the device 100. The power limits in the registers 133 may be changed dynamically, in some examples.

In some embodiments, the controller 112a receives the signal 132 indicative of the total system power, compares the total system power to the configured power limits stored in the registers 133, takes into account the power consumption of the various sockets 108, and runs a control loop feedback mechanism (e.g., a proportional, integral and derivative (PID) control loop) to calculate power budgets to manage system power. The output of this process may be the resolved or allocated power budgets for various components of the device (e.g., sockets 108, memory 132, components 130, etc.). The allocated power budgets can be in terms of power, current, voltage, frequency, and/or the like. The socket 108a, which may run the control loop, may adhere to these budgets and the controller 112a may guarantee the same. In the case of multi-socket system (e.g., as the device 100 comprises more than one socket), the controller 112a of the socket 108a may communicate the new budgets to all other sockets (e.g., socket 108b) and/or other components. In some embodiments, the transmission of the allocated power budgets of the socket 108b (e.g., as allocated by the controller 112a of the socket 108a) may be transmitted from the socket 108a to the socket 108b via an Ultra-Path Interconnect (UPI) Peer-to-Peer (P2P) Mailbox Interface, or any other appropriate interface between two sockets.

The controller 112a receives measurement of power consumed by various sockets 108 of the device 100. Also, as the controller 112a receives measurement of the total system power (e.g., using the sensor 116) and also receives measurement of the power consumed by various sockets 108, the controller 112a may also estimate the power consumed by other components (e.g., components 130, memory 132, etc.) of the device 100. Thus, the controller 112a may be aware of the power budget allocated to various components of the device 100, as well as be aware of the actual power consumed by the various components of the device 100. Thus, in some embodiments, the controller 112a may detect any unused power budget of a component (e.g., a socket 108a).

In some embodiments, the controller 112a may detect any unused power budget of a component and may re-direct such unused power budget towards other components. For example, if there is unused power budget from a memory subsystem, it may be redirected by the controller 112a towards a socket 108a, e.g., which may allow one or more of the cores 110a to operate at higher frequency limits.

In some embodiments, the sensing of the total system power using the sensor 116, the ADC 120 (e.g., which may be included in the VR 118), and the controller 112 may be implemented using hardware and/or firmware. For example, using the SVID interface (or another appropriate high speed interface between the VR 118 and the socket 108a) for the signal 132 and using the ADC 120 within the VR 118 (where the VR 118 and the SVID channel is to operate at relatively fast speed) may allow relatively fast sampling of the measurement of total system power.

The sensing by the sensor 116 may be updated and the corresponding digital signal 132 may be updated, for example, every 80 microseconds. Thus, for example, the controller 112a may receive updated measurement of the total system power every 80 microseconds. In another example, the controller 112a may receive updated measurement of the total system power every 100 microseconds, between every 80-120 microseconds, once every at most 200 microseconds, or the like. In some embodiments, the sampling of the total system power may be sufficiently fast such that the controller 112a may relatively quickly detect any sudden variation or fluctuation in the total system power. The sampling of the total system power may be sufficiently fast such that the controller 112a may detect substantially all spectral energy content of the total system power. In some embodiments, the controller 112a may receive the sampling at a frequency of about 5 KHz. In an example, fast sampling of the total system power may be possible due to the use of the fast SVID channel, as discussed with respect to FIGS. 1-2.

In some embodiments, the control loop may be executed by the controller 112a at a continuous basis. For example, the controller 112a may reevaluate the power budgets for various components at, for example, every 1 millisecond, every 2 milliseconds, every at most 5 milliseconds, or the like.

Figure 4:
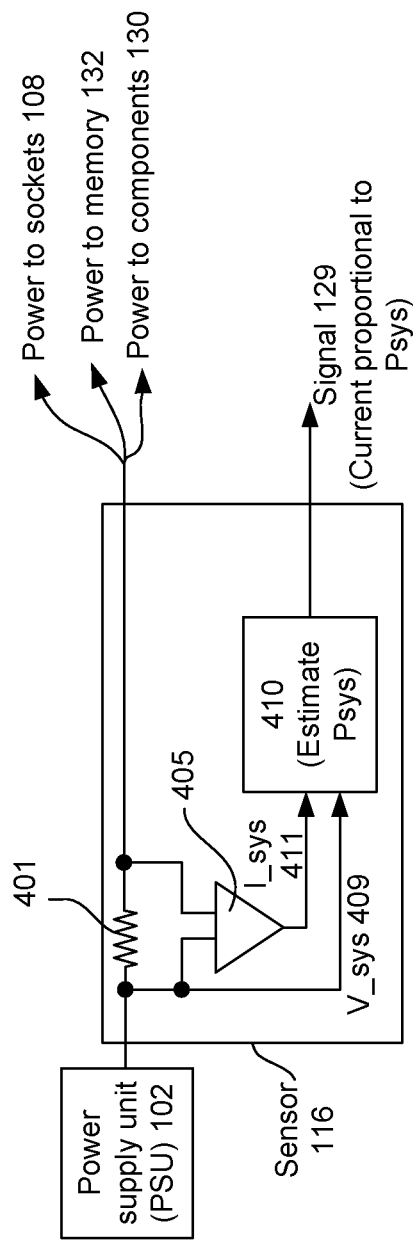
FIG. 4 illustrates an example implementation of a sensor used to measure total system power of the device of FIG. 1, according to some embodiments.

FIG. 4 illustrates an example implementation of the sensor 116 used to measure total system power of the device 100 of FIG. 1, according to some embodiments. Although the sensor 166 in FIG. 4 is illustrated to measure output of the PSU 102 (e.g., as discussed with respect to FIGS. 1-3), the sensor 116 (or another similar sensor) may also be used to measure output power of the battery 103 (e.g., as discussed with respect to FIGS. 2-3).

In some embodiments, the PSU 102 supplies power to the socket 108, the memory 132, the components 130, etc. of the device 100. The sensor 116 may comprise a resistor 401 at the output of the PSU 102 (e.g., the resistor 401 may be a shunt resistor). A comparator 405 may detect a voltage drop across the resistor 401, to generate I_sys 411, which is an estimate of the output current of the PSU 102. Also, voltage V_sys 409 at a terminal of the resistor 401 may be indicate the voltage at the PSU output.

A circuitry 410 of the sensor 116 may receive the measurements of I_sys 411 and V_sys 409. In some embodiments, based on the measurements of I_sys 411 and V_sys 409, the circuitry 410 may estimate a power output Psys of the PSU 102 (e.g., which may be based on a product of the measurements of I_sys 411 and V_sys 409). The circuitry 410 may output the signal 129, which may be indicative of the power output Psys of the PSU 102. For example, the signal 129 may be a current (e.g., a noise immune analog current) that is proportional to the power output Psys of the PSU 102. In some other embodiments, the circuitry 410 may output the I_sys 411 and V_sys 409 (e.g., instead of determining the power Psys)—the determination of the power may be performed, for example, at the controller 112a.

Figure 5:
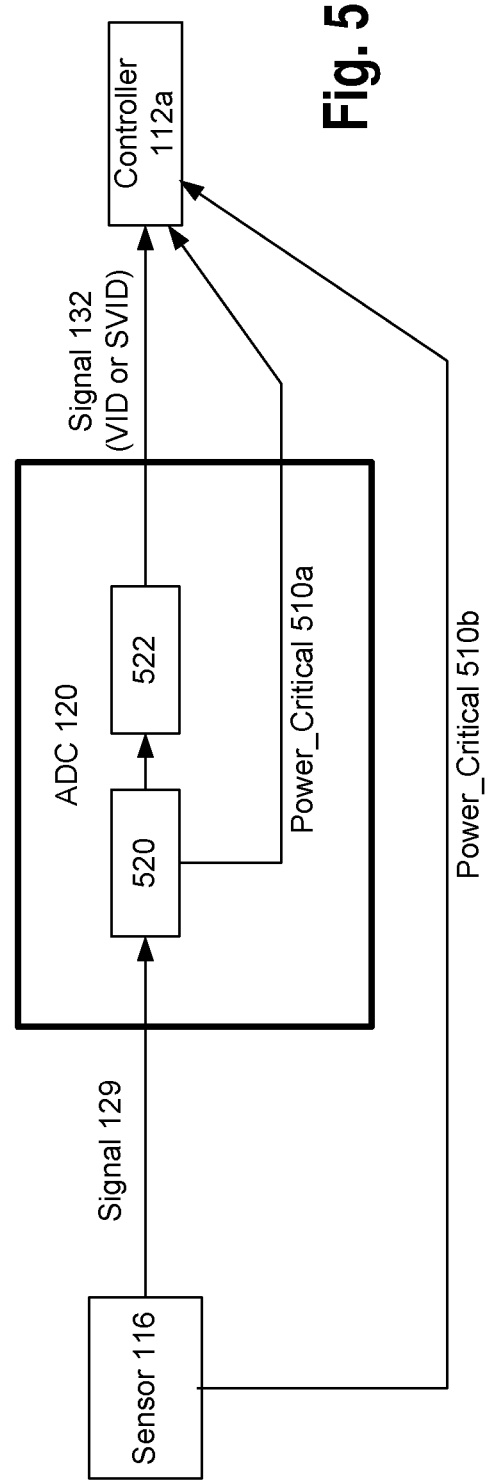
FIG. 5 illustrates an example implementation of the ADC of the device of FIGS. 1-3 and illustrates issuance of critical power signals, according to some embodiments.

FIG. 5 illustrates an example implementation of the ADC 120 of the device 100 of FIGS. 1-3 and illustrates issuance of a critical power signal, according to some embodiments. As discussed with respect to FIG. 4, the sensor 116 may generate the analog signal 129, which may be a current signal proportional to the power output Psys of the PSU 102. The ADC 120 comprises circuitries 520 and 522 to convert the signal 129 to a digital signal 132 (which may be, for example, a SVID signal), which is then transmitted to the controller 112a. The circuitries 520, 522 may be two stages of the ADC 120.

In some examples, the power level of the output of the PSU 102 may reach a critically high level (e.g., may be higher than a threshold), which may be a critical event for the device. Such high level of the output power of the PSU 102 may be due to sudden and rapid increase in power consumption of one or more components of the device 100, due to a fault in the device 100, etc. It may be desired to immediately throttle (e.g., reduce voltage and/or frequency) one or more components (e.g., one or more cores 110 of a socket 108), in response to such a critical event. It may take some time for the controller 112a to be aware of such a critical event, e.g., due to the time taken by the ADC 120 to digitalize the analog signal 129. In some embodiments, to avoid such delay in the identification of the critical event by the controller 112a, the ADC 120 may issue a power_critical signal 510a, which may be a critical power event alert to indicate a critical event (e.g., may indicate that the output power of the device 100 is higher than a threshold).

In some embodiments, the ADC 120 may issue the power_critical signal 510a before completion of the analog-to-digital conversion of the critical power level. Merely as an example, while converting the analog signal 129, if the ADC 120 senses that the signal 129 is higher than a threshold, the ADC 120 may immediately issue the power_critical signal 510a (e.g., without waiting for the completion of the analog-to-digital conversion). Merely as an example, while converting the analog signal 129 to the digital signal 132, if the ADC 120 senses that one or more Most Significant Bits (MSB) of the digital signal 132 indicates a high value of the signal 129, the ADC 120 may immediately issue the power_critical signal 510a (e.g., without waiting for determining all the bits, including the least significant bits (LSBs), of the digital signal 132).

In some embodiments, instead of, or in addition to, the ADC 120 issuing the power_critical signal 510a, the sensor 116 may also issue a power_critical signal 510b to the controller 112a, e.g., to convey that the sensed output power of the PSU 102 is critically high (e.g., higher than a threshold value, for example, for at least a threshold period of time). For example, if the sensor 116 senses that the Psys is higher than the threshold, the sensor 116 may also issue the power_critical signal 510b to the controller 112a.

Thus, for example, the power_critical signals 510a, 510b may indicate a power spike in the output of the PSU 102. In case of critical event such as a power spike, the controller 112 is alerted by the ADC 120 and/or by the sensor 116 using the power_critical signals 510a, 510b. The controller 112 may cause an immediate response (e.g., within few microseconds) by, for example, throttling one or more cores 110 of the socket 108a and/or socket 108b. For example, the controller 112 may throttle the one or more cores 110 in a manner so as to bring total system power to lower levels (e.g., within the platform prescribed limits), thereby protecting the device 100 from being damaged.

In some embodiments, use of the controller 112a may enable migration of the task of power management from software to Central Processing (CPU) hardware or firmware. For example, the controller 112a may be implemented in hardware or firmware, and may use Pcode. This may provide significantly faster response time to mitigate power spikes and/or to ensure faster power control. For example, a software-based solution may have a power peak intercept time of about 25 milliseconds, whereas the controller 112a may have a power peak intercept time of about 1 millisecond, about 3 to 5 milliseconds, or the like.

In some embodiments, use of the controller 112a may enable total device power budget sharing between different device components. For example, the controller 112a may allow dynamic detection and redirection of any residual unused power budget from one or more components to one or more other components, while staying within existing total device power envelope, thereby improving system performance.

In some embodiments, use of the controller 112a may allow for potentially higher CPU core peak frequencies (such as P0n) in some cases. In some embodiments, standardizing the flow of information across device components and the power measurement hardware itself may provide for a more accurate power sensing method.

In some embodiments, use of the controller 112a may increase server rack density and utilization in a server-based system. For example, tighter control over power consumption of the servers may allow for higher server rack density. Server platforms that implement the various features discussed herein for power capping may be able to operate under a tighter peak power envelope. This in turn may allow data center operators to proportionately increase the node density in the server rack or blade designs.

In some embodiments, as the controller 112a may detect power peak relatively fast (e.g., by using the power_critical signals 510a, 510b), redundant capacity of the PSU 102 may be reduced (e.g., as the power peak is detected almost immediately and the cores throttled, long duration of critical power peaks may be avoided).

In some embodiments, dynamic detection and redirection of unused power budget between components of the device 100 (e.g., while staying within the total platform power envelope) may allow achieving higher frequencies for the components to which the unused power is redirected towards. For example, due to the redirection of unused power from a memory 132 to a CPU core 110, the CPU core 110 may operate at a higher frequency, which might even be higher than a rated frequency of the core.

For example, new, higher advertised values of frequencies of the cores 110 may be achieved (e.g., due to dynamic detection and redirection of unused power budget between components of the device 100). For example, the registers 133 (or other storage devices, such as one or more fuses, not illustrated in the figures) may have higher frequency limits for the cores 110. The controller 112a may read these higher frequency limits of the cores 110, which may allow the controller 112a to opportunistically grant permission to the cores 110 to operate at those higher programmed frequencies. In an example, the types of frequency related fuses or registers to be programmed and their associated values may be statically determined during design phase (e.g., using bin-split analysis), taking device power delivery and other constraints (e.g., such as silicon reliability and platform cost) into consideration.

Figure 6:
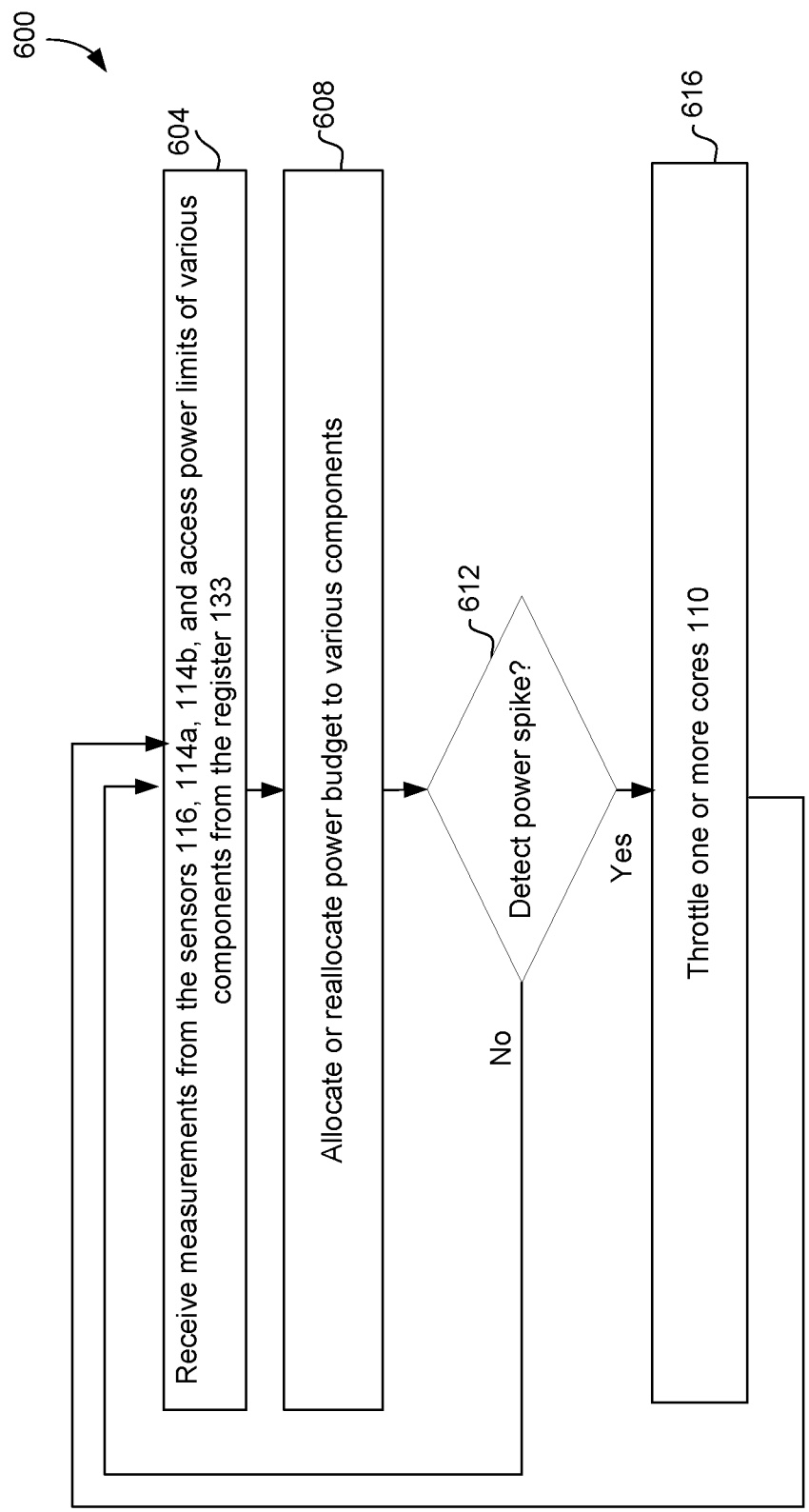
FIG. 6 illustrates a flowchart depicting a method for operating the device of FIGS. 1-5, according to some embodiments.

FIG. 6 illustrates a flowchart depicting a method 600 for operating the device 100 of FIGS. 1-5, according to some embodiments. Although the blocks in the flowchart with reference to FIG. 6 are shown in a particular order, the order of the actions can be modified. Thus, the illustrated embodiments can be performed in a different order, and some actions/blocks may be performed in parallel. Some of the blocks and/or operations listed in FIG. 6 may be optional in accordance with certain embodiments. The numbering of the blocks presented is for the sake of clarity and is not intended to prescribe an order of operations in which the various blocks must occur.

The method 600 comprises, at 604, receiving (e.g., by the controller 112a) measurements from at least one or more of the sensors 116, 114a, 114b. As discussed with respect to FIGS. 1-5, the sensors 114a, 114b may respectively measure power consumption of the sockets 108a, 108b, and the sensor 116 may measure total power input to the device 100. Thus, the controller 112a may be aware in real time power consume by various components of the device 100. The controller 112a may also access power limits of various components, which may be stored in the registers 133.

At 604, the controller 112a may allocate or reallocate power budgets to various components of the device 100, based at least in part on the measurements from the sensors 114a, 114b, 116 and the power limits. For example, if a component does not consume its allocated power, the controller 112a may reallocate the unused power budget from the component to another component.

At 612, the controller 112a may decide if a power spike is detected. For example, the controller 112a may receive power spike detection information via the power_critical signal 510a and/or 510b, as discussed with respect to FIG. 5.

If a power spike is detected (e.g., if "Yes" at 612), then at 616, the controller 112a may throttle one or more cores 110, and then the method 600 may loop back to block 604. If no power spike is detected (e.g., if "No" at 612), then the method 600 may loop back from block 612 to block 604.

Although in FIG. 6 the block 612 is illustrated to occur after block 608, the detection of power spike at 612 and subsequent throttling action based on such detection may be a continuous or ongoing process. For example, at any time in the method 600 (e.g., while receiving the measurements, while allocation power budgets, etc.) if a power spike is detected, the controller 112a may almost immediately (e.g., within 1 to 5 milliseconds, or even less) throttle the one or more cores 110.

Figure 7:
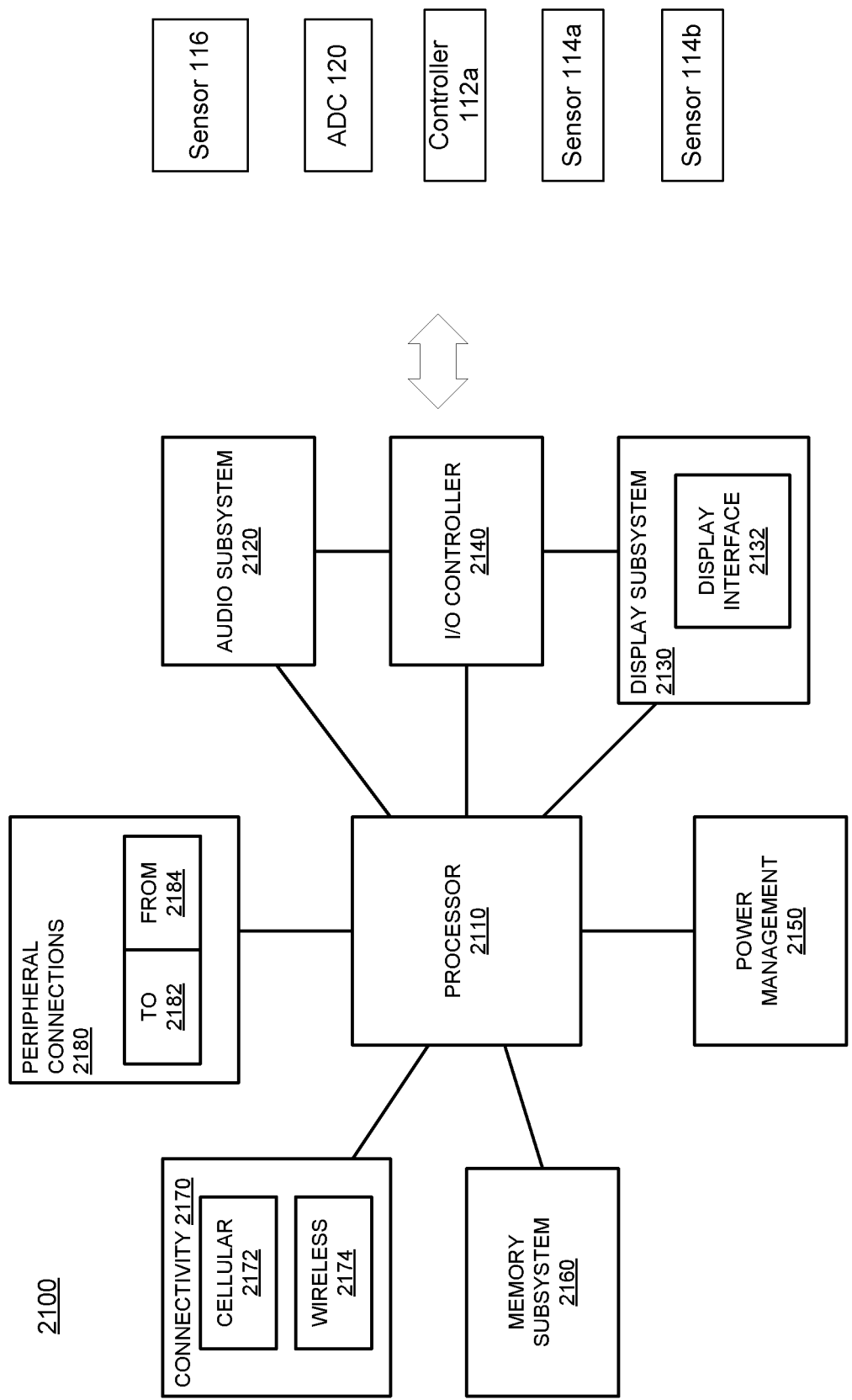
FIG. 7 illustrates a computer system, a computing device or a SoC (System-on-Chip), where a controller may receive system power consumption information and also power consumption information of one or more components, and allocate power budget accordingly, according to some embodiments.

FIG. 7 illustrates a computer system, a computing device or a SoC (System-on-Chip) 2100, where a controller (e.g., controller 112a) may receive system power consumption information (e.g., from sensor 116) and also power consumption information of one or more components (e.g., from sensors 114a, 114b), and allocate power budget accordingly, according to some embodiments. It is pointed out that those elements of FIG. 7 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an TOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may comprise multiple sockets, e.g., sockets 108a, 108b of FIGS. 1-3. For example, various processors of the computing device 2100 may be included in corresponding sockets. The computing device 2100 may also include sensor 116 to measure total system power, ADC 120 to convert the analog measurement of the sensor 116 to corresponding digital measurements, sensors 114a, 114b to measure power consumption of the sockets 108a, 108b, respectively, and the controller 112a to allocate power budgets to various components, e.g., as discussed with respect to FIGS. 1-6 of this disclosure.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

All optional features of the apparatus described herein may also be implemented with respect to a method or process.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a plurality of components;
a first sensor to measure first power consumed by first one or more components of the plurality of components;
a second sensor to measure second power consumed by the apparatus;
an analog-to-digital converter (ADC) to generate an identification (ID) that is representative of the second power consumed by the apparatus; and
a controller to allocate power budget to one or more components of the plurality of components, based on the measurement of the first power and the ID, wherein a power spike is detected if the second power consumed by the apparatus is higher than a threshold value and wherein the ADC is to issue a first power event alert to the controller in response to the power spike being sensed, wherein the ADC is bypassed if the second sensor issues a second power event alert to the controller if the second sensor senses the power spike, wherein the ADC is to:
receive an analog signal from the second sensor, the analog signal being representative of the second power consumed by the apparatus; and
detect, prior to a completion of an analog-to-digital conversion of the measurement of the analog signal, that the analog signal is higher than the threshold value by sensing one or more most significant bits of an output of the ADC.

2. The apparatus of claim 1, further comprising:
a voltage regulator (VR), wherein the VR comprises the ADC.

3. The apparatus of claim 2, wherein the ID representative of the second power is transmitted from the VR to the controller over a Serial Voltage Identification (SVID) interface.

4. The apparatus of claim 3, wherein the VR is to receive a Voltage ID (VID) over the SVID interface, the VID to indicate a voltage level to be output by the VR.

5. The apparatus of claim 1, wherein:
the second sensor is to transmit the second power event alert to the controller by bypassing the ADC.

6. The apparatus of claim 1, wherein the ADC is to:
convert the analog signal to a corresponding digital ID that is representative of the second power consumed by the apparatus.

7. The apparatus of claim 1, wherein the ADC is to:
transmit the first power event alert to the controller, prior to the completion of the analog-to-digital conversion.

8. The apparatus of claim 1, wherein the controller is to receive the first or second power event alert, and in response to the reception of the first or second power event alert, throttle operation of a component of the apparatus.

9. The apparatus of claim 1, wherein the controller is to:
detect that a first component of the plurality of components is not using a power budget allocated to the first component; and
reduce the power budget allocated to the first component, and correspondingly increase a power budget allocated to a second component of the plurality of components,
wherein the controller is to increase the power budget allocated to the second component by facilitating an increase of one or both of a frequency or an operating voltage of the second component.

10. The apparatus of claim 1, further comprising:
a plurality of registers, where an individual register of the plurality of registers is to store a power limit of a corresponding component of the plurality of components, and wherein the controller is to allocate the power budget to the one or more components of the plurality of components in accordance with the power limits stored in the plurality of registers.

11. The apparatus of claim 1, wherein the first one or more components are included in a processor socket of a device, and wherein the first sensor is to measure the first power consumed by the processor socket.

12. The apparatus of claim 1, wherein to measure the second power consumed by the apparatus, the second sensor is to:
measure an output current of a power supply unit, wherein the power supply unit supplies power to the apparatus;
measure an output voltage of the power supply unit; and
estimate the second power, based on the measurements of the output current and the output voltage of the power supply unit.

13. The apparatus of claim 1, wherein the second sensor is to measure the second power consumed by the apparatus at a rate of one measurement every at most 200 microseconds.

14. The apparatus of claim 1, wherein the controller is implemented in hardware or firmware.

15. A system comprising:
a memory to store instructions;
a first processor socket coupled to the memory, the first processor socket comprising: a first plurality of cores to execute the instructions, and a Power Control Unit (PCU);
a second processor socket comprising a second plurality of cores;
a wireless interface to facilitate communication between the first and second processor sockets and another system; and
a first sensor and a second sensor to respectively measure power consumptions of the first and second processor sockets, and a third sensor to measure input power to the system;
an analog-to-digital converter (ADC) to convert analog measurement from the third sensor to corresponding digital measurements, wherein the PCU is to receive the digital measurements from the ADC, wherein a power spike is detected if the input power to the system is higher than a threshold value, wherein the ADC is to issue a first power event alert to the PCU in response to sensing the power spike, wherein the ADC is bypassed if the third sensor issues a second power event alert to the PCU if the third sensor senses the power spike;
wherein the ADC is to detect, prior to a completion of an analog-to-digital conversion of the analog measurement from the third sensor, that the analog measurement is higher than the threshold value by sensing one or more most significant bits of an output of the ADC,
wherein the PCU is to:
receive measurements from the first, second, and third sensors, and
allocate power budgets to the first and second processor sockets and the memory, based at least in part on the measurements from the first, second, and third sensors.

16. The system of claim 15,
wherein the third sensor is to transmit the second power event alert to the PCU.

17. The system of claim 15, wherein the PCU is to throttle operation of one or more the first or second plurality of cores, in response to receiving the first or second critical power event alert.

18. An apparatus comprising:
a first processor socket comprising: a first plurality of cores and a controller;
a second processor socket comprising a second plurality of cores;
a first sensor and a second sensor to respectively measure power consumptions of the first and second processor sockets, and a third sensor to measure input power to the apparatus; and
a Voltage Regulator (VR) to receive measurements from the third sensor and to generate a sense signal indicative of the measurements from the third sensor,
wherein the controller is to receive the measurements from the first and second sensors and the sense signal, and to allocate power budgets to one or more components of the apparatus,
wherein the VR includes an analog-to-digital converter (ADC) to convert an analog measurement from the third sensor to a corresponding digital measurement, wherein the ADC is to detect, prior to a completion of an analog-to-digital conversion of the analog measurement from the third sensor, that the analog measurement is higher than a threshold value by sensing one or more most significant bits of an output of the ADC,
wherein the controller is to receive the digital measurement from the ADC, wherein a power spike is detected if the input power to the apparatus is higher than the threshold value, wherein the ADC is to issue a first power event alert to a PCU in response to sensing the power spike, wherein the ADC is bypassed if the third sensor issues a second power event alert to the PCU if the third sensor senses the power spike.

19. The apparatus of claim 18, further comprising:
a first register to store a first power limit of the first processor socket;
a second register to store a second power limit of the second processor socket;
a memory to store instructions; and
a third register to store a third power limit of the memory,
wherein the controller is to allocate power budgets to the one or more components of the apparatus, based at least in part on one or more of the first, second, or third power limits.

* * * * *